United States Patent [19]
Dudderar et al.

[11] Patent Number: 5,307,983
[45] Date of Patent: May 3, 1994

[54] METHOD OF MAKING AN ARTICLE COMPRISING SOLDER BUMP BONDING

[75] Inventors: Thomas D. Dudderar, Chatham; Chee C. Wong, Newark, both of N.J.

[73] Assignee: AT&T Bell Laboratories, Murray Hill, N.J.

[21] Appl. No.: 54,505

[22] Filed: Apr. 27, 1993

[51] Int. Cl.$^5$ .................... H01L 21/58; B23K 31/02
[52] U.S. Cl. .................. 228/180.22; 228/246; 228/254; 427/123; 427/383.7
[58] Field of Search ............ 228/123.1, 179.1, 180.22, 228/245, 246, 254; 427/123, 383.3, 383.7

[56] References Cited

U.S. PATENT DOCUMENTS

| | | | |
|---|---|---|---|
| 4,832,255 | 5/1989 | Bickford et al. | 228/254 |
| 4,840,302 | 6/1989 | Gardner et al. | 228/123.1 |
| 4,878,611 | 11/1989 | LoVasco | 228/180.22 |
| 4,906,823 | 3/1990 | Kushima et al. | 228/254 |
| 5,186,383 | 2/1993 | Melton et al. | 228/254 |

OTHER PUBLICATIONS

M. J. Wale, et al. "Self-Aligned Flip-Chip Assembly of Photonic Devices with Electrical and Optical Connections", *IEEE Trans. on Components, Hybrids, And Manufacturing Tech.*, vol. 15, No. 2 pp. 225–230 (1992).

K. P. Jackson, et al. "A Compact Multichannel Transceiver Module Using Planar-Processed Optical Waveguides and Flip-Chip Optoelectronic Components", *IEEE Elec. Comp. Tech. Conf.* (1992) pp. 93–97.

K. Katsura, et al. "A Novel Flip-Chip Interconnection Technique Using Solder Bumps for High-Speed Photoreceivers", *J. of Lightwave Technology*, vol. 8, No. 9, pp. 1323–1327, (1990).

Blonder, et al. "Interconnection Processes and Materials", *AT&T Tech. Journal*, (1990).

T. Hayashi, "An Innovative Bonding Technique for Optical Chips Using Solder Bumps That Eliminate Chip Positioning Adjustments", *IEEE Trans. on Comp., Hybrids, and Manufacturing Tech.*, vol. 15, No. 2 (1992).

M. S. Cohen, et al. "Packaging of High-Density Fiber-/Laser Modules Using Passive Alignment Techniques", *IEEE 42nd Electronic Component and Tech. Conf.* (1992) pp. 98–107.

*Primary Examiner*—Samuel M. Heinrich
*Attorney, Agent, or Firm*—Eileen D. Ferguson

[57] ABSTRACT

The present invention is embodied in a technique for precise and accurate height control in fabricating solder bumps or joints formed from a solder bump or bumps. A solder bump is formed by reflow of a conical solder body having base diameter D, height H and cone angle $\theta$, and has truncated sphere shape, with height h and truncation diameter d. We have found that D, H, and d can be selected such that $\partial h/\partial H$ is small (typically $\leq 0.5$), indicative of relative insensitivity of the bump height to variation in the height of the conical solder body. The inventive process is also applicable to a component (e.g., a laser) solder-bonded to a substrate, and can provide previously unattainable control of the spacing between component and substrate.

8 Claims, 5 Drawing Sheets

SOLDER DEPOSIT

REFLOWED BUMP

REFLOWED JOINT

METHOD OF MAKING AN ARTICLE COMPRISING SOLDER BUMP BONDING

FIELD OF THE INVENTION

This invention relates to bonding techniques, more specifically to solder bump bonding.

BACKGROUND OF THE INVENTION

In, e.g., the communication and computer related fields, there exists the need for the fusion of electrical and optical technologies. To facilitate the fusion, packaging of optical fibers and associated optoelectronic components must be advanced. The cost of producing optical and optoelectronic modules is typically dominated by the cost of packaging of the devices rather than the cost of the devices. One aspect of device packaging is the bonding of, e.g., devices, components, assemblies or semiconductor chips (collectively "components") to a substrate. A bonding approach which has been used extensively by the electronics industry is the the flip-chip solder bump technique.

Although solder bump bonding is well established in the electronics industry, only recently has this approach been used in conjunction with optical and optoelectronic components. These new uses of solder bump bonding have revealed limitations of the technique which typically are not of concern in the established applications of the technique. For example, optical and optoelectronic bonding involves more demanding alignment tolerances than are customary in electronic bonding. In the latter, alignment in the substrate plane is typically the only concern. Usually, as long as the wettable pads are correctly positioned on the substrate, the components will be correctly positioned. Alignment in the direction normal to the substrate (z-direction) typically has not been a significant concern in electronic packaging. However, when bonding optical and/or optoelectronic components to a substrate, the components frequently not only need to be accurately aligned in the plane of the substrate (x and y directions) but also in the direction normal to the substrate (z-direction). Exemplarily, if the alignment of an optical waveguide with respect to the associated laser radiation source is off by even 1 μm in any direction, the optical coupling efficiency of the combination can be too low to be acceptable.

Solder bonding a component to a substrate such that the positional variation in the direction normal to the substrate is within, e.g., ±1 μm is difficult. Thus, a process which can satisfy the stringent alignment requirements, especially in the z-direction, that are encountered in optical and optoelectronic packaging is much needed and could significantly reduce the packaging costs associated with optical and optoelectronic packaging. This application discloses such a process.

SUMMARY OF THE INVENTION

This invention is embodied in a method that can provide for improved bonding of a component to a substrate. The inventive method of making an article comprises bonding a "component" (e.g., an optoelectronic device such as a semiconductor laser) to a second body (to be referred as the "substrate") by means of a reflowable material (henceforth collectively a "solder"). The method is importantly premised on our discovery that there exists a region in the relevant parameter space wherein the height (h) of a resolidified solder body (frequently called a solder "bump") can be relatively insensitive to variation in the height (H) of the cone-shaped first solder body from which the bump is derived. This insensitivity (expressed in the condition that the "demagnification factor", $\partial h/\partial H$, is less than a predetermined value, e.g., <0.5) translates into the ability to more closely control the spacing between component and substrate than typically is possible by prior art solder bump bonding techniques.

More specifically, the method comprises providing a substrate having at least one substantially circular (diameter d) wettable (by the solder) first material region (the wettable "footprint") surrounded by a non-wettable (by the solder) second material. On the substrate is formed a substantially conical (base diameter D, height H, angle between base and sidewall θ) first solder body such that the conical solder body contacts (preferably overlies) said wettable footprint. The method further comprises melting the conical first solder body and permitting the melted solder material to resolidify such that a resolidified solder body (the "solder bump") results. The solder bump has truncated-sphere shape, with height h and truncation diameter d, where d is determined by (and equal to) the diameter of the wettable footprint. Significantly, the relevant parameters (including D, d, H, h and θ) are selected such that $\partial h/\partial H \leq 0.5$, preferably <0.3 or even 0.1. Subsequent to formation of the solder bump, the "component" is attached to the substrate by a process that comprises melting the solder bump. The component has at least one wettable footprint which may or may not have a second solder bump formed thereon. The second solder bump is formed in substantially the same manner as the solder bump.

Although the inventive technique will typically be used to form a solder joint of closely controlled thickness between a component and a substrate, the technique can, for instance, also be used to form solder bumps of a closely controlled height on an appropriate body, e.g., a Si wafer that is to serve as substrate for one or more components, but that itself is an article of commerce.

The inventive technique offers precision and uniformity in z-axis alignment, thereby expanding, for instance, the capability of passive laser-to-fiber alignment schemes to control all six relevant degrees of freedom.

DETAILED DESCRIPTION

Figure 1A:
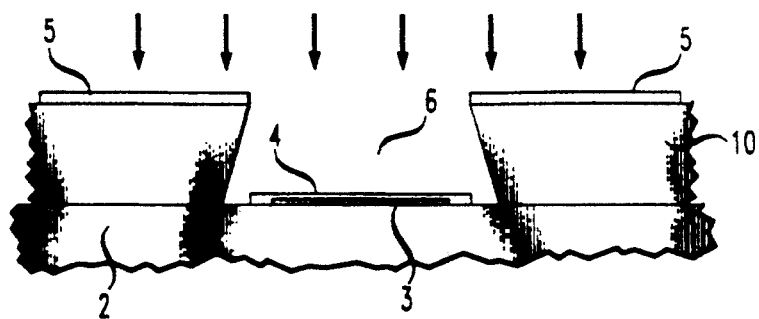
FIGS. 1A, 1B and 1C illustrate the line-of-sight evaporation process.
Figure 1B:
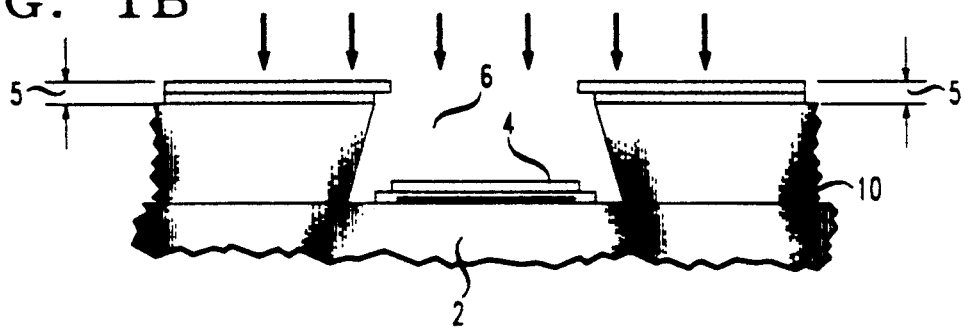
Figure 1C:
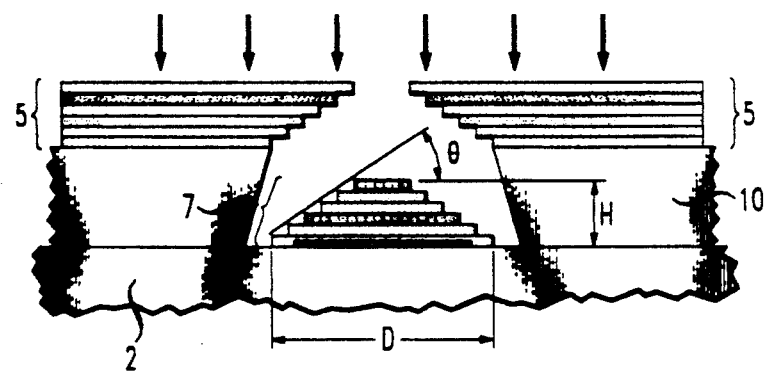

The inventive method involves formation of a substantially conical body of solder on a substrate by any suitable technique. The currently preferred technique is well known in the art and involves line-of-sight deposition of solder through apertures ("vias") in a lift-off mask on a substrate. For details, see, for instance, G. E. Blonder, et al., "Interconnection Processes and Materials" *AT & T Technical Journal* November/December 1990, p. 46. FIGS. 1A–1C schematically illustrate the technique. Numeral 2 refers to the substrate, 10 to the patterned lift-off mask, 3 to the wettable footprint (e.g., Cu, Ni, Ag, Au) on the (non-wettable) substrate 2, and 4 and 5 refer to solder deposits, with deposit 4 ultimately becoming (due to partial or complete occlusion of the via) cone-shaped first solder body 7, with base diameter D, height H and cone angle $\theta$. The exposition below assumes that wettable footprint 3 is circular, although other shapes (e.g., ellipsoidal) could, at least in principle, be used. The shape and size of the first solder body is determined, inter alia, by the via 6 in the lift-off mask. The profile of via 6 typically is slightly tapered so that deposition does not occur on the side walls.

Figure 2:
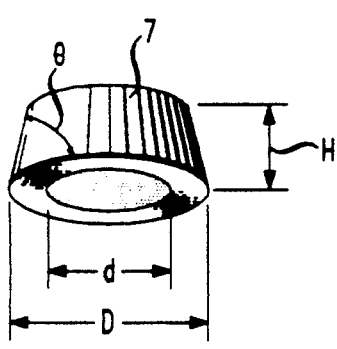
FIG. 2 shows a deposited truncated cone shaped solder body prior to reflow.

FIG. 2 schematically depicts an exemplary first solder body. The cone angle, $\theta$, is determined by the particular processing system used to fabricate the deposited feature. Important factors which affect the angle, $\theta$, are the type and thickness of the lift-off mask, the angle of incidence of the evaporation system, and the type of solder being evaporated.

After the first solder body has been formed, the lift-off mask is removed from the substrate, leaving the first solder body on the substrate. Subsequent to lift-off, the substrate with the first solder body thereon is briefly heated above the solder melting temperature and then the solder is allowed to resolidify. This melting/resolidification process will be referred to as "reflow". Reflow transforms the conical shaped first solder body into a truncated sphere (referred to as "solder bump") positioned only on the wettable footprint. The ability of the molten solder to conform to a predictable shape is an important aspect of the inventive method.

Figure 3:
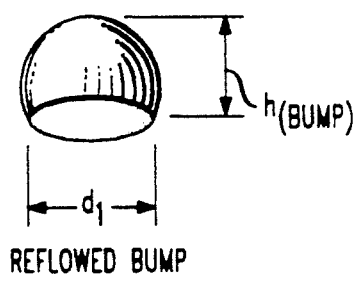
FIG. 3 shows a deposited solder body after reflow, i.e., a solder bump.

Dimensions of interest of a solder bump, shown in FIG. 3, include the bump height, h (bump), and the truncation diameter d, which is equal to the footprint diameter, d.

Referring to the dimensional definitions in FIGS. 2 and 3, the volume of a first solder body is given by $$V_S = \frac{\pi H}{12}\left(3D^2 - \frac{6DH}{\tan\theta} + \frac{4H^2}{\tan^2\theta}\right) \quad (1)$$

and the volume of the solder bump is given by $$V_B = \pi h(\text{bump})\left(\frac{d^2}{8} + \frac{h(\text{bump})^2}{6}\right) \quad (2)$$

The parameter $\theta$ is characteristic of the processing system and can be regarded as a constant in any given case. Dimensions d and D are controlled by the precision in lithography. On the other hand, H depends on, e.g., evaporation rate and is relatively difficult to control. Consequently, the normalized variation associated with H typically substantially exceeds the normalized variations associated with d and D. Below, both h (bump) and h (joint) (see FIG. 4) will be designated "h", with the exact meaning adducible from the context.

A further parameter which affects the shape change of the solder bump is the consolidation factor of the solder. This factor accounts for macroscopic density differences in the solder before and after reflow. The consolidation factor, C, can be readily determined experimentally for each processing system and can also be regarded as a constant in any given case. The volume of the conical solder body is related to the volume of the solder bump through the consolidation ratio C:

$$CV_S = V_B \quad (3)$$

Grouping terms, the general equation for h, which here stands for height of the solder bump, is given by $$h^3 + \frac{3}{4}d^2h - \frac{HC}{2}\left(3D^2 - \frac{6DH}{\tan\theta} + \frac{4H^2}{\tan^2\theta}\right) = 0 \quad (4)$$

This is a cubic equation which can be solved analytically.

The value of h is determined by the parameters C and $\theta$ and the variables H, D, and d as follows:

$$h = \left[\frac{C}{4}\left(3D^2H - \frac{6DH^2}{\tan\theta} + \frac{4H^3}{\tan^2\theta}\right) + \sqrt{\frac{C^2}{16}\left(3D^2H - \frac{6DH^2}{\tan\theta} + \frac{4H^3}{\tan^2\theta}\right)^2 + \frac{d^6}{24}}\right]^{\frac{1}{3}} + \left[\frac{C}{4}\left(3D^2H - \frac{6DH^2}{\tan\theta} + \frac{4H^3}{\tan^2\theta}\right) - \sqrt{\frac{C^2}{16}\left(3D^2H - \frac{6DH^2}{\tan\theta} + \frac{4H^3}{\tan^2\theta}\right)^2 + \frac{d^6}{24}}\right]^{\frac{1}{3}} \quad (5)$$

Figure 9:
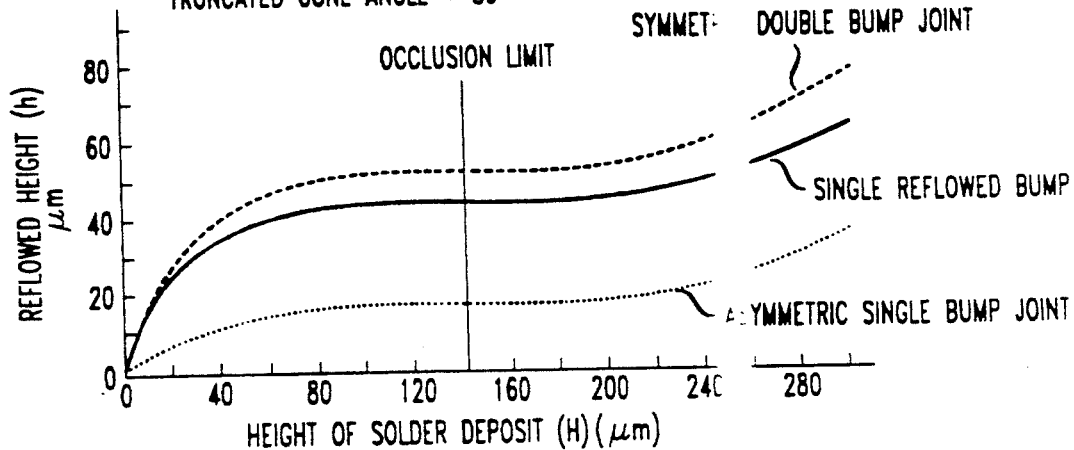
FIG. 9 illustrates the dependence of a reflowed bump/joint heights to deposited solder heights.

Based on this equation, the dependence of h on the various variables can be calculated and plotted. FIG. 9 shows the dependence of h on H, and exemplifies the unexpected feature that is an important aspect of our invention.

There are three distinct regions: at low H, h rises with a cube root dependence on H; at intermediate H, h is weakly dependent on H; and, at high H, h rises again relatively steeply.

The intermediate region of the curve corresponds to the portion of the parameter space wherein $\partial h/\partial H$ is relatively small, and is exemplary of the above referred to unexpected feature. The inflexion point of the curve, to be called the occlusion limit, corresponds to growth of the truncated cone to a cone, with further solder deposition denied by the full closure of the mask opening. This occlusion limit occurs at $$H/D = \frac{\tan\theta}{2}.$$

The third region of the curve beyond the occlusion limit is unphysical, purely a mathematical artifact.

The most important part of this curve, for embodiments of the instant invention, is in the second region up to the occlusion limit. The saturation of h with H opens up the possibility of achieving reflowed bump/joint heights h which are relatively insensitive to the variations in the solder body height H.

The "demagnification factor" $\partial h/\partial H$, is the change in h per unit change in H. For example, a demagnification factor of 0.1 means that a 1 $\mu$m error in H will result in only a 0.1 $\mu$m error in h. Attention to this factor will allow a designer to select appropriate levels of sensitivity of h to variations in H. The demagnification factor exemplarily is determined from equation 2 using the following procedure. If the number of independent variables is reduced from 3 to 2 by introducing the following new variables:

$$R = H/D, \quad d' = d/D$$

then equation (5) becomes plots, vertical or horizontal sections of the surface plots are typically taken, depending on which variables are the desired primary targets. For example, if the design targets are H/D = 1, 2, 3, etc. vertical sections of the surface plot along these values of H/D can be represented as contour maps in a 2-dimensional plot of demagnification factor versus d/D. Those skilled in the art will be able to carry out such a program, based on the information provided herein.

Figure 12:
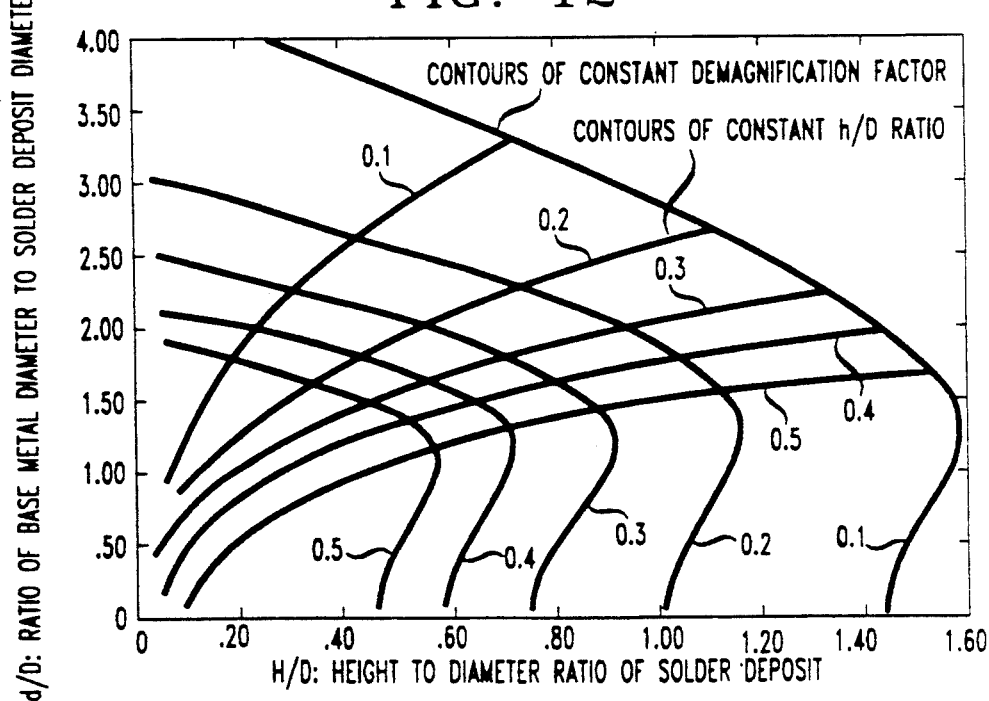
FIG. 12 shows contour plots of the demagnification factor and reflow height h/D for a single reflow bump.

The following discussion exemplifies the case where the demagnification factor, and the reflowed height h, are the two target variables, each with a range of interest of 0.1 to 0.5. Horizontal sections are made in the surface plots at the values of interest to produce contour maps of demagnification factor and reflowed height in H/D-d/D space. These contour plots are shown in FIG. 12. The lines in the plots represent constant value contours of the demagnification factor and the normalized reflowed height h/D. For example, if the targeted demagnification ratio is 0.1, and a targeted normalized reflowed height is 0.3, then the intersection of these two contours determines the H/D ratio to be 1.3 and the d/D ratio to be 2.25. At this point the designer can specify one more variable (H, D, d, or h), after which all remaining dimensional variables will be automatically determined. For example, if D is chosen to be 100, then H will be 130, d will be 225 and h will be 30.

The contour plots emphasize the difference between the target variables and the independent variables, with the latter to be selected so as to achieve the desired $$h' = \frac{h}{D} = \left[\frac{C}{4}\left(3R - \frac{6R^2}{\tan\theta} + \frac{4R^3}{\tan^2\theta}\right) + \sqrt{\frac{C^2}{16}\left(3R - \frac{6R^2}{\tan\theta} + \frac{4R^3}{\tan^2\theta}\right)^2 + \frac{d'^6}{64}}\right]^{\frac{1}{3}} + \tag{6}$$

$$\left[\frac{C}{4}\left(3R - \frac{6R^2}{\tan\theta} + \frac{4R^3}{\tan^2\theta}\right) - \sqrt{\frac{C^2}{16}\left(3R - \frac{6R^2}{\tan\theta} + \frac{4R^3}{\tan^2\theta}\right)^2 + \frac{d'^6}{64}}\right]^{\frac{1}{3}}$$

If we let $$A_1 = 3R - \frac{6R^2}{\tan\theta} + \frac{4R^3}{\tan^2\theta}, \quad A_2 = \frac{\partial A_1}{\partial R} = 3 - \frac{12R}{\tan\theta} + \frac{12R^2}{\tan^2\theta}, \quad B = \frac{C}{4}$$

then $$\frac{\partial h'}{\partial R} = \frac{\partial\left(\frac{h}{D}\right)}{\partial\left(\frac{H}{D}\right)} = \frac{\partial h}{\partial H} = \frac{1}{3\left(A_1B + \sqrt{A_1^2B^2 + \frac{d'^6}{64}}\right)^{\frac{2}{3}}}\left(A_2B + \frac{A_1A_2B^2}{\sqrt{A_1^2B^2 + \frac{d'^6}{64}}}\right) + \tag{7}$$

$$\frac{1}{3\left(A_1B - \sqrt{A_1^2B^2 + \frac{d'^6}{64}}\right)^{\frac{2}{3}}}\left(A_2B - \frac{A_1A_2B^2}{\sqrt{A_1^2B^2 + \frac{d'^6}{64}}}\right)$$

Figure 10:
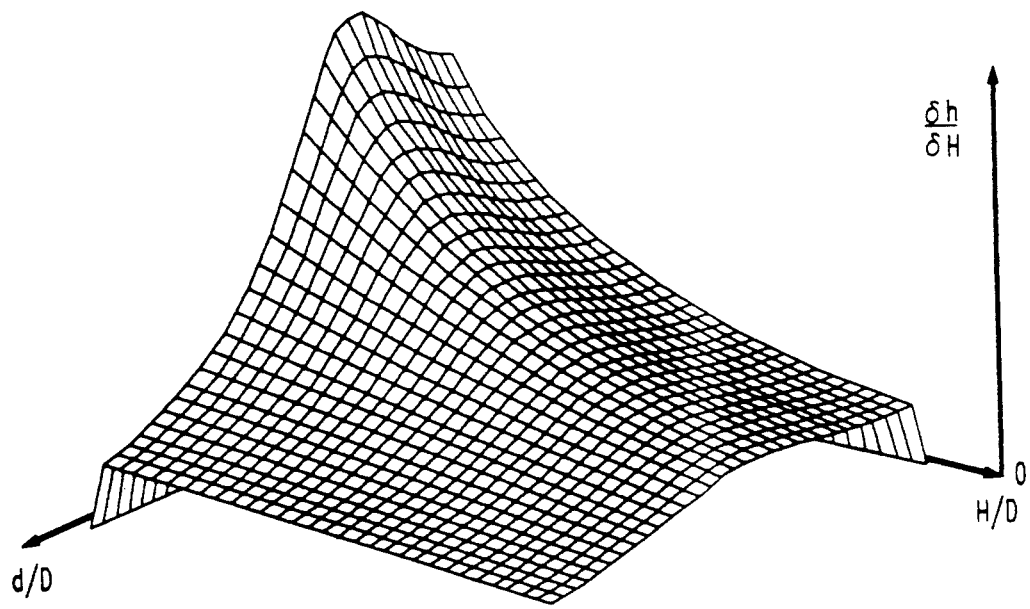
FIG. 10 is a surface plot of the demagnification factor.
Figure 11:
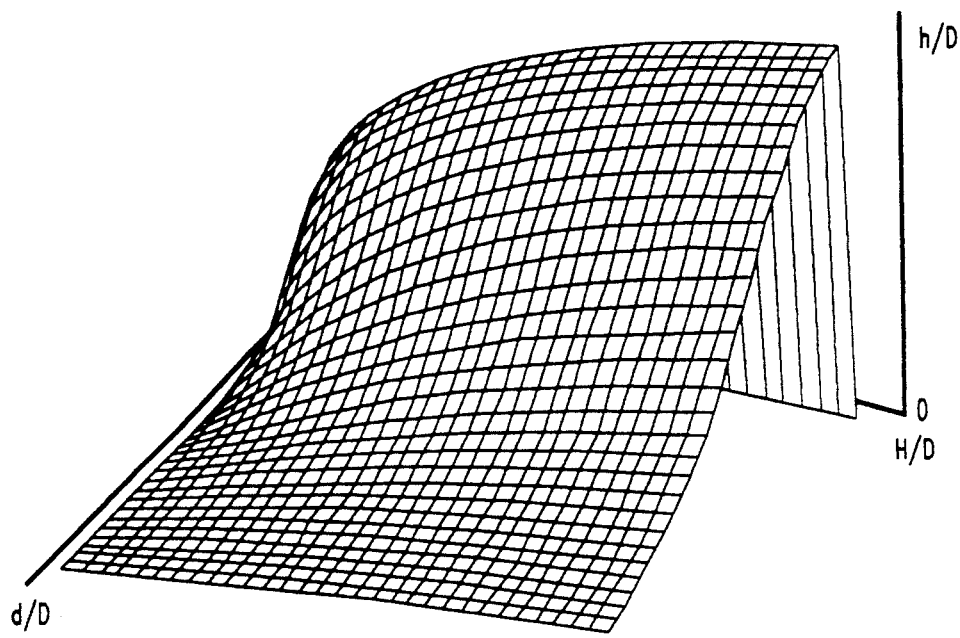
FIG. 11 is a surface plot of h/D.

The ratios H/D and d/D contain all the information necessary for designing bumps with substantially uniform heights. A surface plot of demagnification factor in H/D-d/D space is shown in FIG. 10. Similarly, FIG. 11 shows a plot of h/D. For the purpose of this discussion, the consolidation ratio C exemplarily is assumed to be 0.98 and the cone angle is assumed to be 80 degrees. Thus, a specification of the ratios H/D and d/D uniquely determines the demagnification factor as well as the normalized reflowed bump height h/D. In order to get quantitative information from these or analogous values of the former. In the above discussion, demagnification factor and reflowed height are the target variables, whereas H/D and d/D are the independent variables.

The above discussion is substantially in terms of a solder bump (or bumps) on a substrate, e.g., an appropriately prepared silicon wafer. Although we anticipate commercial use of such substrates according to the invention (i.e., comprising solder bumps whose height h is within previously unattainably narrow limits of a design value), we expect significant commercial use to involve a substrate according to the invention with a component (e.g., a laser) solder-bonded thereto. Below we will extend the discussion to that case.

Figure 4:
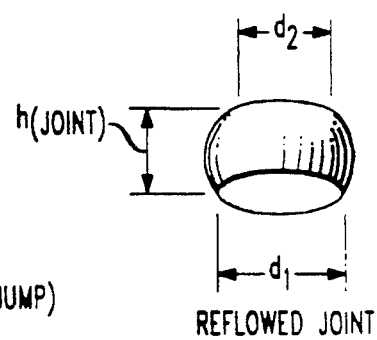
FIG. 4 shows a joined deposited solder feature after reflow.
Figure 5:
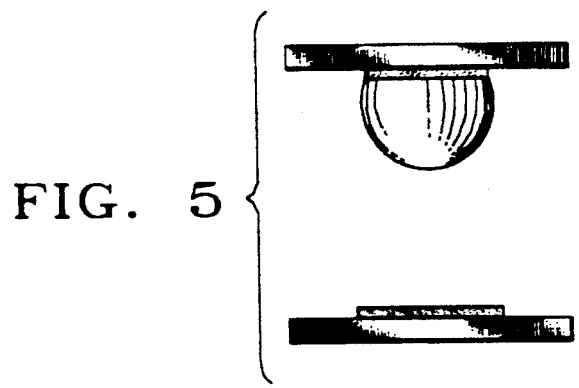
FIG. 5 depicts a symmetric single bump joining configuration.
Figure 6:
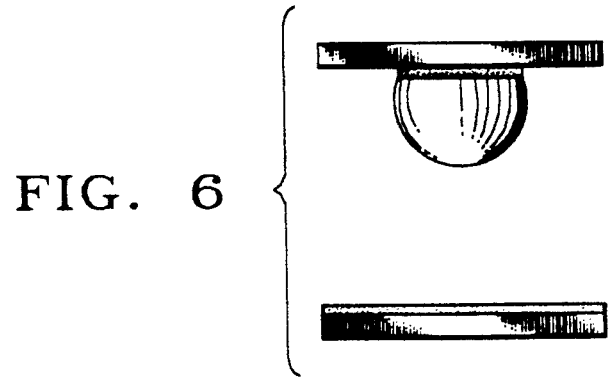
FIG. 6 depicts an asymmetric single bump joining configuration.
Figure 7:
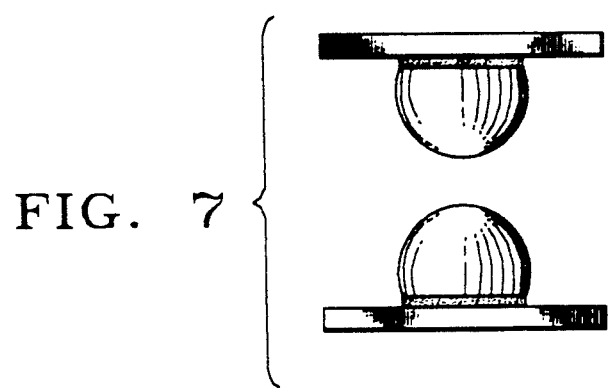
FIG. 7 depicts a symmetric double bump joining configuration.
Figure 8:
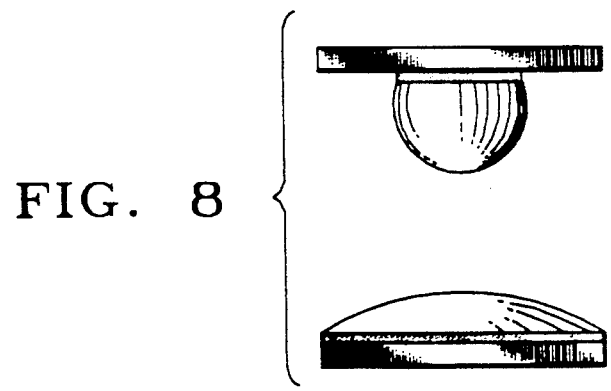
FIG. 8 depicts an asymmetric double bump joining configuration.

FIG. 4 exemplifies a solder bump between a substrate and a component, with the former having a footprint of diameter $d_1$, and the latter having a footprint of diameter $d_2$. FIGS. 5-8 illustrate various possibilities, namely, symmetric and asymmetric single bump (FIGS. 5 and 6, respectively) and double bump (FIGS. 7 and 8, respectively) configurations. By a symmetric configuration we mean that $d_1 = d_2$, and by an asymmetric one we mean that $d_1$ is not equal to $d_2$.

We will consider the footprint of diameter $d_1$ to be associated with a "first" truncated cone solder body, and the footprint of diameter $d_2$ with a "second" truncated cone solder body. The volume of a double-truncated sphere (see FIG. 4) is given by:

$$V_j = \pi h \left( \frac{d_1^2}{8} + \frac{d_2^2}{8} + \frac{h^2}{6} \right) \quad (8)$$

This volume will be referred to as the "joint" volume. The joint volume is related to the volume of the first and second solder bodies through the consolidation factor C. For the general case of an asymmetric double bump joint, one has $$C[V_{S1} + V_{S2}] = V_j \quad (9)$$

where $V_{S1}$ and $V_{S2}$ are the volumes of the first and second solder bodies, respectively. Grouping terms, the general equation for h, which in this case stands for h (joint), is given by:

$$h^3 + \frac{3}{4}(d_1^2 + d_2^2)h - \frac{C}{2}\left\{ 3(D_1^2 H_1 + D_2^2 H_2) - 6\left( \frac{D_1 H_1^2}{\tan\theta_1} + \frac{D_2 H_2^2}{\tan\theta_2} \right) + 4\left( \frac{H_1^3}{\tan^2\theta_1} + \frac{H_2^3}{\tan^2\theta_2} \right) \right\} = 0, \quad (10)$$

wherein subscripts 1 and 2 refer to the first and second solder bodies, respectively.

This is a cubic equation which can be solved analytically. Thus, the final height of a joint can be solved for. Using equation 10, the dependence of the final joint height on the other dimension can be calculated and plotted. FIG. 9 shows the variation of h with H for an exemplary symmetric double bump joint and an exemplary asymmetric single bump joint.

Figure 13:
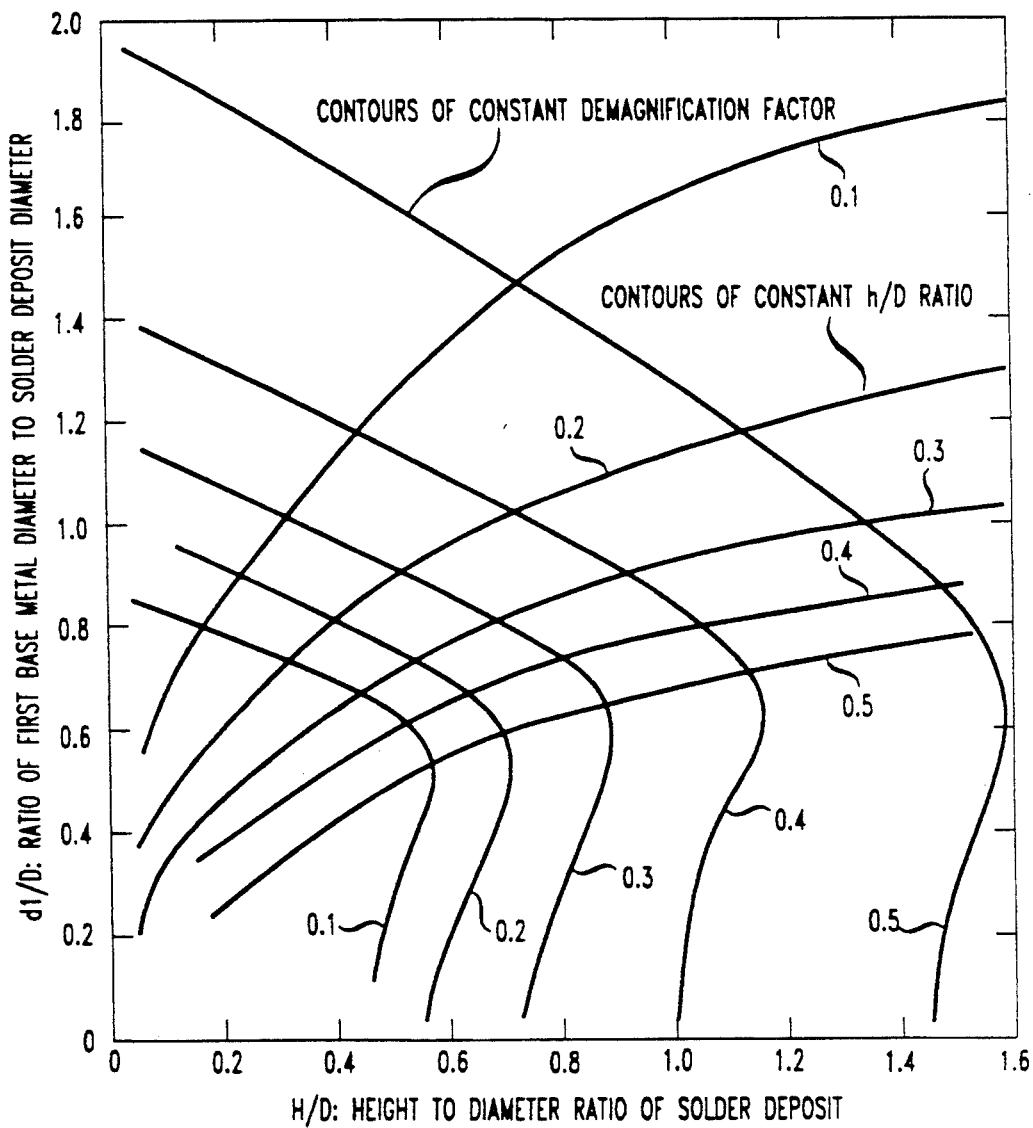
FIG. 13 shows contour plots of the demagnification factor and reflow height h/D for an asymmetric single bump joint where $d_2/d_1=2$.

The previous procedures for defining contour plots for the demagnification factor and the normalized height for single reflowed bumps can be readily extended to solder joints. For instance, in the case of an asymmetric single bump joint configuration with a specified ratio of $d_2/d_1$, footprint diameters $d_2/d_1$, the general shape of the contour plots for solder joints resemble those shown in FIG. 12 for single reflowed bumps, but change according to the ratio of the wettable footprint diameters $d_2/d_1$. FIG. 13 shows a contour plot for an asymmetric single bump joint configuration wherein $d_2/d_1 = 2$. Individual contour plots for any desired $d_2/d_1$ ratio can be readily constructed using equations (2)-(4) and (7), as those skilled in the art will recognize.

These and other herein disclosed design tools make possible attainment of previously unattainable design specifications, especially with regard to permitted variations in the spacing of a component above a substrate. Typically, designs will be selected such that $\partial h/\partial H$ is less than or equal to 0.5, preferably less than 0.3 or even 0.1, since for $\partial h/\partial H > 0.5$ the attainable benefit will typically be too small to be of commercial significance.

We claim:

1. Method of making an article that comprises a first body attached to a second body (to be referred to as the "substrate") by means that comprise reflowable material (to be referred to as "solder"), the method comprising:
   a) providing the substrate having a major surface that comprises at least one circular region of a first material that is wettable by the solder, said first material region being surrounded by a second material that is substantially not wettable by the solder, said first material region having diameter d;
   b) forming on said first material region a substantially conical solder body associated with said solder body being a base of diameter D, a side wall, a conical height H and an angle $\theta$ (to be referred to as the "cone angle") between said base and said side wall;
   c) causing said conical solder body to melt forming a molten material;
   d) causing said molten material to re-solidify, such that a resolidified solder body (to be referred to as the first solder bump) results, said first solder bump having a truncated sphere shape, of height h, and truncation diameter d; and
   e) attaching the first body to the substrate by a process that comprises melting said solder bump; Characterized In That
   f) H, D, d and $\theta$ are selected such that a demagnification factor $\partial h/\partial H$, is less than or equal to 0.5.

2. A method according to claim 1, comprising forming said conical solder body by a process that comprises line-of-sight deposition through an aperture in a liftoff mask.

3. A method according to claim 1, wherein said first body comprises at least one circular region, of diameter $d_2$, of a material that is wettable by the solder.

4. A method according to claim 3, further comprising the steps of
   a) forming on the circular region of said first body a second conical solder body having a base of diameter D', a side wall, a conical height H' and a cone angle $\theta'$ between said base and said side wall;
   b) causing said second conical solder body to melt forming a molten material;
   c) causing said molten material to re-solidify such that a second resolidified solder body (to be referred to as the second solder bump) results, said second solder bump having a truncated sphere shape of height h', and truncation diameter d'; wherein
   d) H', D', d' and $\theta'$ are selected such that a demagnification factor $\partial h'/\partial H'$ is less than or equal to 0.5.

5. A method according to claim 4, wherein attaching the first body to the substrate comprises:
   a) bringing said first solder bump into contact with said second solder bump;
   b) melting said first and second solder bumps; and c) allowing the melted solder to solidify.

6. A method according to claim 3, wherein attaching the first body to the substrate comprises:
   a) bringing said first solder bump into contact with said circular region of said first body;
   b) melting said first solder bump; and
   c) allowing the melted material to solidify.

7. Method according to claim 1, wherein the first body is a semiconductor laser.

8. A method of making an article that comprises a substrate with a solder bump thereon, the method comprising:
   a) providing the substrate having a major surface that comprises at least one circular region of a first material that is wettable by a solder, said first material region being surrounded by a second material that is substantially not wettable by the solder, said first material region having diameter d;
   b) forming on said first material region a substantially conical solder body having a base of diameter D, a side wall, a conical height H and an angle $\theta$ between said base and said side wall;
   c) causing said conical solder body to melt forming molten solder;
   d) causing said molten solder to re-solidify, such that the solder bump results, said solder bump having a truncated sphere shape, of height h, and truncation diameter d; Characterized In That
   e) H, D, d and $\theta$ are selected such that a demagnification factor $\partial h/\partial H$ is less than or equal to 0.5.

* * * * *